US012755864B2

(12) United States Patent
Komori et al.

(10) Patent No.: US 12,755,864 B2
(45) Date of Patent: Oct. 6, 2026

(54) CABLE WITH ABNORMALITY SIGN DETECTION FUNCTION AND WIRE ABNORMALITY SIGN DETECTION SYSTEM

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Hirokazu Komori, Yokkaichi (JP); Takahiro Murata, Yokkaichi (JP); Fujio Sonoda, Osaka (JP); Masato Izawa, Osaka (JP); Takumi Ooshima, Kanuma (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 178 days.

(21) Appl. No.: 18/727,203

(22) PCT Filed: Jan. 26, 2023

(86) PCT No.: PCT/JP2023/002386

§ 371 (c)(1),
(2) Date: Jul. 8, 2024

(87) PCT Pub. No.: WO2023/145803

PCT Pub. Date: Aug. 3, 2023

(65) Prior Publication Data

US 2025/0095880 A1 Mar. 20, 2025

(30) Foreign Application Priority Data

Jan. 28, 2022 (JP) ................................ 2022-011409

(51) Int. Cl.
*H01B 7/32* (2006.01)
*G01R 31/58* (2020.01)
*H01B 7/04* (2006.01)

(52) U.S. Cl.
CPC ............... *H01B 7/32* (2013.01); *G01R 31/58* (2020.01); *H01B 7/04* (2013.01)

(58) Field of Classification Search
None
See application file for complete search history.

(56) References Cited

U.S. PATENT DOCUMENTS 5,120,905 A 6/1992 Cousin et al.
11,456,091 B2 * 9/2022 Huang .................. G08B 17/02
(Continued)

FOREIGN PATENT DOCUMENTS

JP 2006-032060 A 2/2006
JP 2007-299608 A 11/2007
(Continued)

OTHER PUBLICATIONS

Apr. 18, 2023 International Search Report issued in International Patent Application No. PCT/JP2023/002386.
(Continued)

*Primary Examiner* — Jermele M Hollington
(74) *Attorney, Agent, or Firm* — Oliff PLC

(57) ABSTRACT

A cable with an abnormality sign detection function and a wire abnormality sign detection system that can perform stepwise detection of signs leading to breakage in a wire accurately. The cable contains a target wire containing a wire conductor and a wire covering that covers the conductor and a detection line containing a detection line conductor and a detection line covering that covers the detection line conductor, where the detection line conductor has a shorter flex life than the wire conductor and contains long-life elemental
(Continued)

wires and short-life elemental wires having a shorter flex life than the long-life elemental wires, each of the long-life and short-life elemental wires containing a solid wire made of a conductive material and an insulation covering layer covering the solid wire, and in the detection line conductor, the short-life elemental wires are arranged in a layer around a bundle of the long-life elemental wires.

6 Claims, 5 Drawing Sheets

(56) References Cited

U.S. PATENT DOCUMENTS

| | | | | |
|---|---|---|---|---|
| 12,462,952 | B2 * | 11/2025 | Komori | G01R 31/083 |
| 2013/0222002 | A1 * | 8/2013 | Eshima | H01B 7/328<br>324/750.15 |
| 2021/0233677 | A1 | 7/2021 | Jordan | |
| 2021/0296023 | A1 | 9/2021 | Nakao et al. | |
| 2021/0319929 | A1 * | 10/2021 | Matsumura | H01B 7/18 |
| 2023/0018984 | A1 | 1/2023 | Zhang et al. | |
| 2023/0258739 | A1 | 8/2023 | Sonoda et al. | |
| 2023/0420158 | A1 * | 12/2023 | Komori | H01B 7/32 |
| 2025/0095877 | A1 * | 3/2025 | Ooshima | H01B 7/0216 |

FOREIGN PATENT DOCUMENTS

| | | | | |
|---|---|---|---|---|
| JP | 2007-305478 | A | 11/2007 | |
| JP | 2013-182716 | A | 9/2013 | |
| JP | 2021-162449 | A | 10/2021 | |
| JP | 2022179553 | A * | 12/2022 | H01B 7/32 |

OTHER PUBLICATIONS

Apr. 4, 2023 International Search Report issued in International Patent Application No. PCT/JP2023/000993.

U.S. Appl. No. 18/727,195, filed Jul. 8, 2024 in the name of Komori et al.

Apr. 7, 2026 Office Action issued in U.S. Appl. No. 18/727,195.

* cited by examiner

[5A]

[5B]

CABLE WITH ABNORMALITY SIGN DETECTION FUNCTION AND WIRE ABNORMALITY SIGN DETECTION SYSTEM

TECHNICAL FIELD

The present disclosure relates to a cable with an abnormality sign detection function and a wire abnormality sign detection system.

BACKGROUND ART

Electric wires are installed and laid in various electrical and electronic devices, transportation equipment, buildings, and public facilities. With the long-term use of the wires, damage such as wire breakage may occur. For example, when an electric wire is subjected to repeated bending or vibration, a break may occur in a conductor contained in the wire due to metal fatigue. Damage such as wire breakage should desirably be detected at the stage when signs of the damage appear, such as at the stage when metal fatigue is in progress, before the damage actually occurs. If the damage can be detected at the stage when only the signs appear, it is possible to prevent the occurrence of problems caused by the wire damage, including functional failure of the device in which the wire is installed, by implementing measures such as replacement of the wire.

As an example of a cable which is intended for detection of signs of wire damage, Patent Document 1 discloses a cable with a wire disconnection detection function. The cable contains a detecting wire containing a conductor formed by twisting a plurality of strands, and a detected wire containing a conductor formed by twisting a plurality of strands, where a twist pitch of the conductor of the detecting wire is longer than that of the conductor of the detected wire. By making the twist pitch of the conductor of the detecting wire longer than that of the conductor of the detected wire, the flex life of the detecting wire is made to be shorter than that of the detected wire, which allows prediction of wire disconnection.

Patent Document 2 discloses a wire breakage detection device. The device contains an electric cable containing a plurality of electric wires, an electric shield layer covering the plurality of electric wires, and a sheath covering the electric shield layer; a wire breakage detection line that is provided on the electric shield layer, containing a conductor wire and an insulation covering layer covering the conductor wire; a voltage source electrically connected to the conductor wire; a first detector electrically connected to the conductor wire; and a second detector electrically connected to the electric shield layer. The flex life of the wire breakage detection line is set shorter than the flex life of the electric wires. Patent Document 2 describes that while a voltage is applied to the conductor wire of the wire breakage detection line by the voltage source, breakage of the electric shield layer is predicted based on detected signals of the first and second detectors.

Patent Document 3 discloses a cable with a wire breakage detection function. The cable contains a core wire containing a conductor and an insulator covering the conductor, and a wire breakage detection line. The wire breakage detection line contains a plurality of elemental wires, each containing a conductor wire and an insulation covering the conductor wire. The plurality of elemental wires consists of two or more types of elemental wires with different flex lives. Patent Document 3 states that the detection line can cause stepwise breaks since the detection line contains the elemental wires with different flex lives in combination. The document further states that by insulating the elemental wires in the detection line individually, the changes in resistance due to breaks of the elemental wires appear clearly, thus enabling more accurate detection of wire breakage. The two types of elemental wires are arranged alternately in the circumferential direction of the wire breakage detection line, as shown in FIG. 1 of Patent Document 3.

CITATION LIST

Patent Literature

Patent Document 1: JP 2013-182716 A
Patent Document 2: JP 2007-305478 A
Patent Document 3: JP 2007-299608 A

SUMMARY OF INVENTION

Technical Problem

As described in Patent Documents 1-3, if a target wire intended for detection of signs of breakage is accompanied by a detection line that breaks more easily by bending than the target wire, it is possible to detect signs of breakage in the target wire by monitoring the occurrence of breaks in the detection line. In particular, as described in Patent Document 3, by using a combination of two or more types of elemental wires having different flex lives to form a detection line, it is possible to detect signs of breakage in the target wire in a stepwise manner through stepwise breaks in the detection line. However, if the configuration of the detection line containing elemental wires with different flex lives is improved further, it may be possible to detect the signs of breakage in the target wire more accurately.

In view of the above, the objective is to provide a cable with an abnormality sign detection function and a wire abnormality sign detection system that can perform stepwise detection of signs leading to breakage in a wire accurately.

Solution to Problem

A cable with an abnormality sign detection function according to the present disclosure contains a target wire containing a wire conductor and a wire covering that covers the wire conductor; and a detection line containing a detection line conductor and a detection line covering that covers the detection line conductor. In the cable, the detection line conductor, as a whole, has a shorter flex life than the wire conductor. The detection line conductor contains long-life elemental wires and short-life elemental wires having a shorter flex life than the long-life elemental wires, where each of the long-life and short-life elemental wires contains a solid wire made of a conductive material and an insulation covering layer covering the solid wire. In the detection line conductor, the short-life elemental wires are arranged in a layer around a bundle of the long-life elemental wires.

A wire abnormality sign detection system according to the present disclosure contains the cable with the abnormality sign detection function and a measurement unit to measure a characteristic impedance of the detection line conductor of the detection line contained in the cable.

Advantageous Effects of Invention

The cable with the abnormality sign detection function and the wire abnormality sign detection system according to the present disclosure can perform stepwise detection of signs leading to breakage in a wire accurately.

DESCRIPTION OF EMBODIMENTS

Description of Embodiments of Present Disclosure

Figure 1:
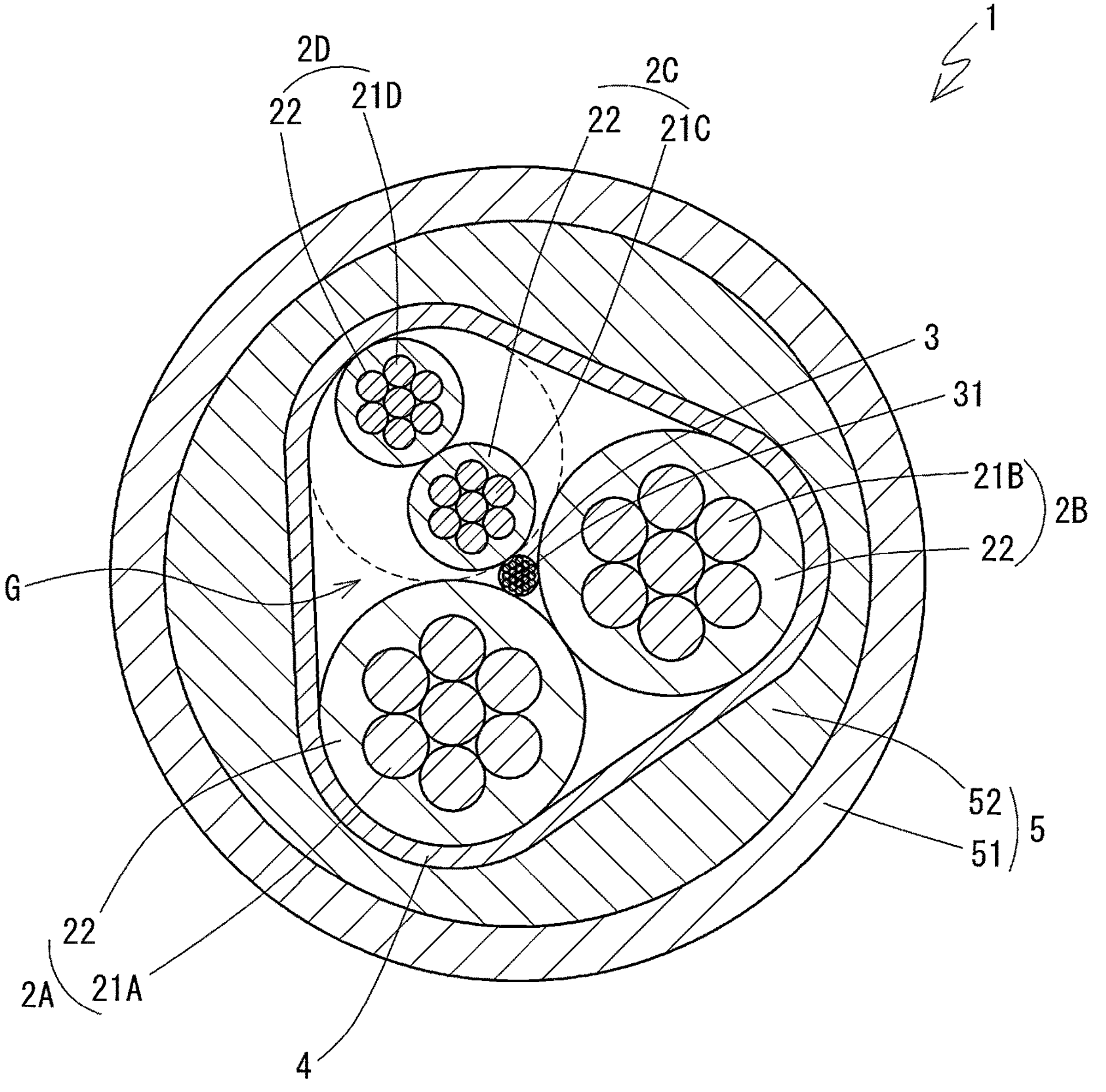
FIG. 1 is a cross-sectional view of a cable with an abnormality sign detection function according to an embodiment of the present disclosure.

First, embodiments of the present disclosure will be explained.

A cable with an abnormality sign detection function according to an embodiment of the present disclosure contains a target wire containing a wire conductor and a wire covering that covers the wire conductor; and a detection line containing a detection line conductor and a detection line covering that covers the detection line conductor. In the cable, the detection line conductor, as a whole, has a shorter flex life than the wire conductor. The detection line conductor contains long-life elemental wires and short-life elemental wires having a shorter flex life than the long-life elemental wires, where each of the long-life and short-life elemental wires contains a solid wire made of a conductive material and an insulation covering layer covering the solid wire. In the detection line conductor, the short-life elemental wires are arranged in a layer around a bundle of the long-life elemental wires.

The above-described cable with the abnormality sign detection function contains the detection line that contains the detection line conductor having a shorter flex life than the wire conductor of the target wire. Thus, when loads are repeatedly applied to the cable by bending or vibration, the elemental wires contained in the detection line conductor are likely to break in a shorter period of time than the wire conductor of the target wire. When a break occurs in any of the elemental wires in the detection line, the break can be detected through an electrical measurement, such as a measurement of characteristic impedance, whereby signs of breakage can be detected appearing in the target wire before the breakage actually occurs in the target wire.

In the above-described cable, the detection line conductor contains two types of elemental wires: long-life elemental wires having a relatively long flex-life and short-life elemental wires having a relatively short flex life. The short-life elemental wires break before the long-life elemental wires when loads are repeatedly applied to the detection line conductor by bending or vibration. Thus, a measurement value obtained through the electrical measurement on the detection line conductor changes in a stepwise manner, first due to breaks of the short-life elemental wires and then due to breaks of the long-life elemental wires. By detecting these stepwise changes, it is possible to detect the signs of breakage in the wire conductor of the target wire in a stepwise manner. Here, the difference in ease of breaking between the elemental wires derived from the difference in the flex lives thereof is amplified by the arrangement of the two types of elemental wires in which the short-life elemental wires are arranged in a layer around the bundle of the long-life elemental wires, whereby significant difference is made in the timing of breaks between the short-life and the long-life elemental wires. Thus, the timings of breaks between the short-life and long-life elemental wires are separated clearly, depending on the degree of loads applied to the detection line conductor. Moreover, particularly as for the short-life elemental wires, breaks of individual single elemental wires can be detected as a result of the electrical measurement, whereby the degree of loads applied to the detection line can be distinguished in finely divided stages. Furthermore, when the electrical measurement is made with an alternating current, breaks of short-life elemental wires located on the outer circumference of the entire detection line conductor can be detected with especially high sensitivity due to the skin effect. As explained above, by adopting the arrangement in which the layer of the short-life elemental wires having the shorter flex life surrounds the bundle of the long-life elemental wires in the detection line conductor, it is possible to detect the signs of breakage in the target wire while clearly distinguishing the signs into multiple stages. Especially in the phase where the breaks of the short-life elemental wires are in progress, it is possible to detect the signs of breakage in the target wire in multiple stages sensitively.

Here, the long-life and short-life elemental wires should have mutually different flex lives preferably by having a difference in at least one of a constituent material and diameter of the solid wire. Then, the difference in the flex life can easily be made between the two types of elemental wires.

It is preferable that the conductive material composing the long-life elemental wires should be a copper alloy, and the conductive material composing the short-life elemental wires should be copper or a copper alloy having lower flex durability than the conductive material composing the long-life elemental wires. Alternatively, it is also preferable that the conductive material composing the long-life elemental wires should be an aluminum alloy, and the conductive material composing the short-life elemental wires should be aluminum or an aluminum having lower flex durability than the conductive material composing the long-life elemental wires. By employing these metal materials for the long-life and short-life elemental wires, a large difference in the flex life can easily be made between the long-life and short-life elemental wires using such general metal materials.

The cable should preferably contain a power wire and a communication wire, each of which constitutes the target wire. In this case, the detection line can be used commonly to detect signs of breakage in both the power wire and the communication wire.

A wire abnormality sign detection system according to an embodiment of the present disclosure contains the cable with the abnormality sign detection function and a measurement unit to measure a characteristic impedance of the detection line conductor contained in the cable. As described above, repeated application of loads to the detection line conductor causes stepwise breaks of the short-life elemental wires and subsequent breaks of the long-life elemental wires. The characteristic impedance of the detection line conductor changes, reflecting the stepwise breaks of the short-life and long-life elemental wires sensitively. Thus, by measuring the characteristic impedance of the detection line conductor by the measurement unit and by detecting changes in the characteristic impedance, it is possible to detect the signs of breakage in the target wire in a stepwise manner accurately through indications by the stepwise breaks of the elemental wires in the detection line conductor.

[Detailed Description of Embodiments of Present Disclosure]

A detailed description of a cable with an abnormality sign detection function and a wire abnormality sign detection system according to embodiments of the present disclosure will now be provided, referring to the drawings. The cable with the abnormality sign detection function according to the embodiment of the present disclosure is a cable capable of detecting signs leading to damage in a target wire contained in the cable. The wire abnormality sign detection system according to the embodiment of the present disclosure is a system for detecting signs leading to damage in the target wire contained in the cable with the abnormality sign detection function.

(1) Configuration of Cable With Abnormality Sign Detection Function

Figure 2:
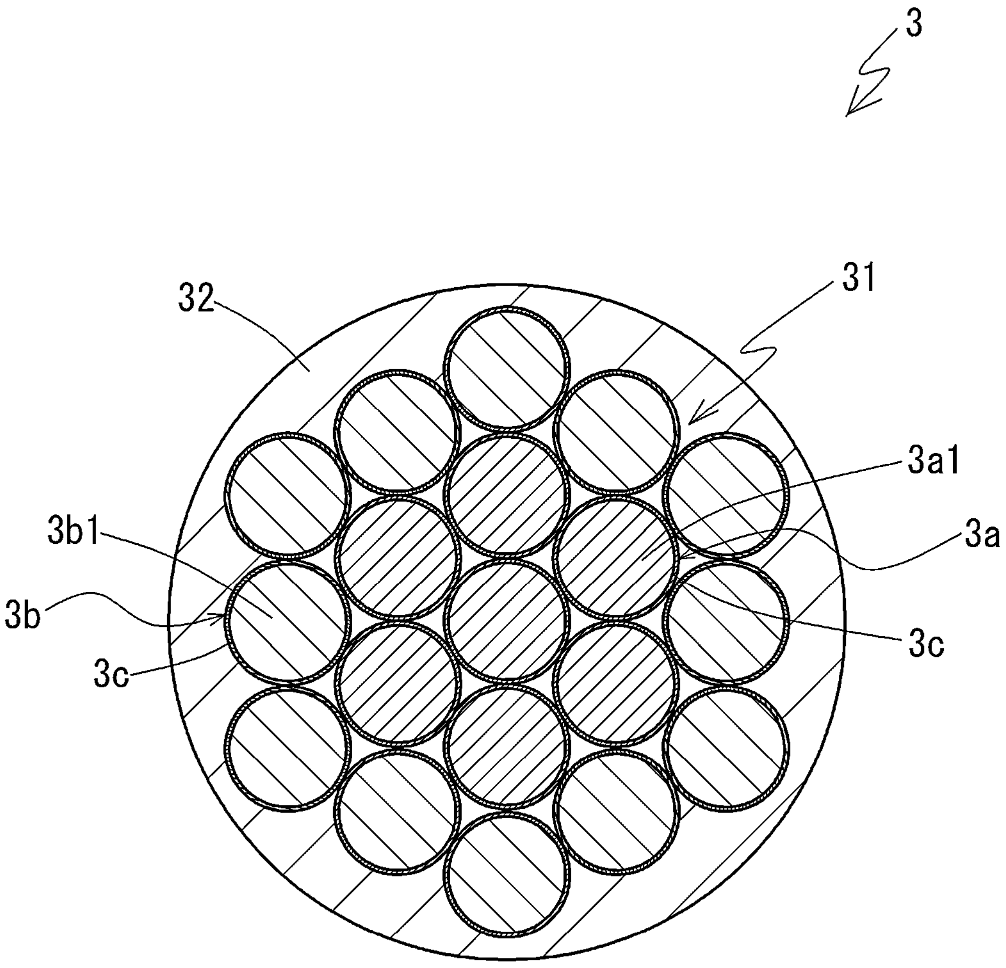
FIG. 2 is a cross-sectional view of a detection line contained in the above-described cable with the abnormality sign detection function.

First, an overview of the configuration of a cable with an abnormality sign detection function (hereinafter, also referred to simply as cable) according to an embodiment of the present disclosure will be described. FIG. 1 displays the configuration of the cable with the abnormality sign detection function 1 according to the embodiment of the present disclosure in a cross-sectional view perpendicular to the axial direction of the cable 1. The cable with the abnormality sign detection function 1 contains target wires 2 (2A-2D), a detection line 3, a tape layer 4, and a sheath 5. FIG. 2 shows a cross-section of the detection line 3.

The target wires 2 are wires that perform functions required in a device where the cable 1 is installed, such as power supply, voltage application, and communication. The target wires 2 are intended as targets for which signs of breakage should be detected in the cable 1. The number of target wires 2 is not specifically limited and may be one or more. Each of the target wires 2 contains a wire conductor 21 (21A-21D) configured as a conductor wire and a wire covering 22 that is made of an insulating material and covers the wire conductor 21. In the configuration shown in FIG. 1, the cable 1 contains four target wires 2A-2D. Two of the four wires are power wires 2A and 2B. The other two are communication wires 2C and 2D, which have a smaller conductor cross-sectional area than the power wires 2A and 2B, and are twisted with each other to form a twisted pair. In the figure, the outer edge of the twisted pair is indicated by a dashed line. This type of composite cable containing power wires 2A and 2B and communication wires 2C and 2D is used for an electric brake in an automobile, for example.

The detection line 3 is a wire that is configured to detect occurrence of signs of breakage in the target wires 2 by undergoing breaks in itself, as will be explained later about its function. The detection line 3 contains a detection line conductor 31 configured as a conductor wire and a detection line covering 32 that is made of an insulating material and covers the detection line conductor 31. The number of detection lines 3 contained in the cable 1 is not specifically limited and may be one or more. Though the cable 1 described mainly in the following sections contains only one detection line 3, the cable 1 may contain a plurality of detection lines 3 having detection line conductors 31 whose elemental wires are mutually different in the material, diameter, or number. The detection line covering 32 should preferably be provided as a component separate from the detection line conductor 31 in view of ensuring the insulation of the detection line conductor 31; however, later-described insulation covering layers 3*c* deposited on the outer peripheries of the elemental wires 3*b*, which constitute the outer circumferential portion of the detection line conductor 31, may function also as the detection line covering 32.

The detection line conductor 31 has a shorter flex life than the wire conductors 21 of the target wires 2. In the present specification, the flex life of a conductor or an elemental wire indicates the period of time until a break occurs in the conductor or elemental wire when the conductor or elemental wire is subjected to bending. The flex life can, for example, be evaluated as the number of bending cycles until the break occurs when the conductor or elemental wire is subjected to repeated cycles of bending at a predetermined angle. A larger number of bending cycles indicates a longer flex life (i.e., higher flex durability). As will be explained later, the detection line conductor 31 contains multiple types of elemental wires. The flex life of the detection line conductor 31 as a whole, that is, the flex life of the assembly of all the elemental wires 3*a* and 3*b*, is shorter than the flex life of the wire conductor(s) 21 of the target wire(s) 2. When the cable 1 contains a plurality of target wires 2, the flex life of the detection line conductor 31 is shorter than the flex life of each of the wire conductors 21 of the plurality of target wires 2. When the power wires 2A and 2B and the communication wires 2C and 2D are contained in the cable 1, the power wires 2A and 2B, which have a larger conductor cross-sectional area than the communication wires 2C and 2D, generally have a shorter flex life. The detection line conductor 31 has an even shorter flex life than the power wires 2A and 2B.

Examples of means to provide a difference in the flex lives of the conductors 21 and 31 between the target wires 2 and the detection line 3 are as follows: if the number of elemental wires constituting a stranded conductor having a fixed cross-sectional area is larger, the flex life of the conductor is longer. If the diameter of the elemental wires constituting the conductor is smaller, the flex life of the conductor is longer. If the conductive material composing the conductor exhibits higher flex durability as a material property, such as having higher Young's modulus, rigidity modulus, or bending strength, the flex life of the conductor is longer. If the twist pitch of elemental wires in the conductor is shorter, the flex life of the conductor is longer, as described in Patent Document 1.

In the cable 1, the target wires 2 and the detection line 3 are all assembled into a wire group G. In the wire group G, the relative positions of the target wires 2 and the detection line 3 are not specifically limited; however, it is preferable that the detection line 3 should be placed in the center, and the plurality of target wires 2 should surround the detection line 3. In this case, if the cable contains a plurality of detection lines 3, the detection lines 3 should preferably be placed together in the center. The detection line 3 and the target wires 2 may simply be assembled into a wire bundle; however, it is preferable that the bundle, including the detection line 3 in the center and the surrounding target wires 2, should be twisted as a whole. In this case, the detection line 3 in the center is also twisted.

The tape layer 4 is placed around the wire group G. The tape layer 4 serves to separate the target wires 2 and the detection line 3 constituting the wire group G from the sheath 5. The form and material of the tape layer 4 are not specifically limited; however, in a preferable example, a tape made of an insulating material such as paper or resin is spirally wound around the wire group G. The tape layer 4 contacts with the wire group G closely. In other words, the tape layer 4 is in contact with the outer circumferences of the wires facing the outermost circumference of the wire group G among the wires 2A-2D and 3 that constitute the wire group G (i.e., the outer circumferences of the target wires 2A, 2B, and 2D in FIG. 1).

The sheath 5 is configured as an extrusion-molded body of an insulator mainly containing a polymer material and surrounds the tape layer 4. The sheath 5 constitutes the outermost circumference of the entire cable 1. The sheath 5 contacts with the outer circumference of the tape layer 4 closely. The sheath 5 should preferably be in contact with the entire outer circumference of the tape layer 4 without having any gaps between the sheath 5 and the tape layer 4, except for unavoidable gaps. Though the sheath 5 may be composed of one or more layers, the sheath 5 described in the figure contains two layers: an outer layer 51 and an inner layer 52. The outer layer 51 is made of a material having higher mechanical properties, such as higher abrasion resistance, than the inner layer 52. In the cable 1, the tape layer 4 may be omitted. In this case, the sheath 5 is formed as an extrusion-molded body in direct contact with the outer circumference of the wire group G. Since the sheath 5 is formed as an extrusion-molded body and in close contact with the outer circumference of the wire group G optionally via the tape layer 4, the positional relationship between the target wires 2 and the detection line 3 is hard to be changed, which allows the detection line 3 to detect the signs of breakage in the target wires 2 accurately with sensitivity independent from the position and timing.

(2) Configuration of Detection Line Conductor

Next, detection line conductor 31, contained in the detection line 3 in the cable with the abnormality sign detection function 1, will be described. The detection line conductor 31 is configured as an assembly of a plurality of elemental wires. The conductor 31 is not composed of all identical elemental wires but includes two types of elemental wires: long-life elemental wires 3*a* and the short-life elemental wires 3*b*. Each of the long-life elemental wires 3*a* and the short-life elemental wires 3*b* is composed of a solid wire 3*a*1 or 3*b*1 made of a conductive material and an insulation coating layer 3*c* covering the solid wire 3*a*1 or 3*b*1 individually. The solid wire made of the conductive material of the short-life elemental wire 3*b* has a shorter flex life than the solid wire of the long-life elemental wire 3*a*. Hereafter, the flex life of the solid wire made of the conductive material constituting the elemental wire may be referred to simply as the flex life of the elemental wire.

In the cable 1 according to the present embodiment, a plurality of long-life elemental wires 3*a* is assembled in the center, forming a bundle. Around the bundle of the long-life elemental wires 3*a*, a plurality of short-life elemental wires 3*b* is placed in a layer. In other words, the long-life elemental wires 3*a* and the short-life elemental wires 3*b* are arranged in separate layers. Thus, there is a region facing the outer circumference of the detection line conductor 31, where only the short-life elemental wires 3*b* are arranged along the circumferential direction of the conductor 31, whereas there is another region inside the conductor 31 where only the long-life elemental wires 3*a* are arranged along the circumferential direction of the conductor 31. Only one layer of the short-life elemental wires 3*b* is arranged around the bundle of the long-life elemental wires 3*a* in the configuration shown in the figure; however, the short-life elemental wires 3*b* may be arranged in two or more layers. In the detection line conductor 31, it is preferable that twisting should preferably be applied to the entire assembly of the long-life elemental wires 3*a* and the short-life elemental wires 3*b* having the above-described specific arrangement.

As described above, the short-life elemental wires 3*b* have a shorter flex life than the long-life elemental wires 3*a*. The short-life elemental wires 3*b* and the long-life elemental wires 3*a* may have mutually different flex lives by having mutual difference in at least one of the constituent material and diameter of the solid wires 3*a*1 and 3*b*1. As for the difference in the constituent material, the long-life elemental wires 3*a* may be made of a material having higher flex durability as a material property, such as having higher Young's modulus, rigidity modulus, or bending strength, than the short-life elemental wires 3*b*. As for the difference in the diameter, the long-life elemental wires 3*a* may have a smaller diameter than the short-life elemental wires 3*b*. Preferably, the long-life elemental wires 3*a* and the short-life elemental wires 3*b* should differ from each other at least in the constituent material. In this case, the long-life elemental wires 3*a* should be made of a material having higher flex durability. For example, as conductive materials preferably used for the elemental wires, a copper alloy can be used for the long-life elemental wires 3*a* while copper (i.e., soft copper) can be used for the short-life elemental wires 3*b*. For another example, an aluminum alloy can be used for the long-life elemental wires 3*a*, while aluminum can be used for the short-life elemental wires 3*b*. For yet another example, a copper alloy or aluminum alloy having relatively high flex durability can be used for the long-life elemental wires 3*a*, while another copper alloy or aluminum alloy having higher flex durability can be used for the short-life elemental wires 3*b*.

As described above, the long-life elemental wires 3*a* and the short-life elemental wires 3*b* individually have the insulation coating layers 3*c*. Thus, the elemental wires are mutually insulated, between the long-life elemental wires 3*a* and the short-life elemental wires 3*b*, among the long-life elemental wires 3*a*, and among the short-life elemental wires 3*b*. The type and thickness of the insulation coating layers 3*c* are not specifically limited; however, the layers 3*c* should preferably be formed as enamel coating layers.

(3) Method for Detection of Wire Breakage

When the cable 1 described above is installed in a device and undergoes repeated bending or vibration during use, metal fatigue may be accumulated in the wire conductors 21 contained in the target wires 2, which may lead to breakage in the target wires 2. If breakage occurs in the target wires 2, the target wires 2 may no longer be able to perform the functions thereof, such as power supply or communication, whereby the device in which the cable 1 is installed may no longer be able to maintain the normal operations thereof. Furthermore, problems such as failure may occur in the device due to the breakage in the target wires 2.

However, the cable 1 according to the present embodiment contains the detection line 3 with the detection line conductor 31 having a shorter flex life than the wire conductors 21 of the target wires 2, in addition to the target wires 2, which perform designated functions within the device. If the cable 1 undergoes repeated bending or vibration, the detection line conductor 31, which has a shorter flex life, is likely to experience a break before the wire conductors 21. Occurrence of the break in the detection line conductor 31 indicates that the target wires 2 have also been subjected to loads due to the bending or vibration, and that metal fatigue has been accumulated in the wire conductors 21. Thus, the wire conductors 21 in the target wires 2 may also experience a break if the loads continue to be applied to the wire conductors 21. The break in the detection line conductor 31 can be detected by an electrical measurement, such as a measurement of characteristic impedance. Here, a break in the detection line conductor 31 is defined as break(s) of at least one of the solid wires 3*a*1 and 3*b*1 made of the conductive materials in the elemental wires (i.e., long-life elemental wires 3*a* and short-life elemental wires 3*b*) constituting the detection line conductor 31.

Thus, through detection of the break in the detection line conductor 31, which has a shorter flex life, the presence of signs of breakage in the wire conductors 21 of the target wires 2 can be detected in advance, even before the breakage actually occurs in the target wires 2. If measures, such as replacement of the target wires 2 with new ones, are taken when the signs of breakage in the target wires 2 are detected, problems caused by the breakage in the target wires 2 can be prevented proactively. In the present specification, breakage in the wire conductors 21 of the target wires 2 may be referred to simply as breakage in the target wires 2.

Examples of the inspection methods for detecting signs of breakage in the target wires 2 using the detection line 3 in the cable 1 according to the present embodiment include a method where a characteristic impedance (or another electrical parameter obtained through an electrical measurement; the same applies hereafter) is measured while an electrical signal is input to the detection line conductor 31. For the measurement of the characteristic impedance, a test signal with an alternating current component is input to the entire detection line conductor 31, including the long-life elemental wires 3*a* and the short-life elemental wires 3*b*, with respect to the external ground potential. A response signal is detected by a reflection or transmission method, preferably by a reflection method.

If there is a break of any of the elemental wires 3*a* or 3*b* in the middle of the detection line conductor 31, reflection of the electrical signal occurs at the position of the break. The reflection causes a discontinuous change in the response signal. Therefore, if a change exceeding a standard value is observed in the measured characteristic impedance, it can be judged that a break has occurred in the detection line conductor 31, and that signs of breakage appear in the wire conductors 21 of the target wires 2. If the detection line conductor 31 has the form of a simple straight line, a break of any of the elemental wires 3*a* and 3*b* constituting the detection line conductor 31 typically causes a change in the value of characteristic impedance in the direction of an increase. A change in the characteristic impedance may also be caused by damage to the detection line conductor 31 that does not result in a break of any of the elemental wires 3*a* and 3*b*. Though the present specification deals with changes in the characteristic impedance caused by the break in the detection line conductor 31 as the representative, damage to the detection line conductor 31 other than the break can also be utilized for detection of the signs of breakage in the target wires 2 via changes in the characteristic impedance, in the same way as the break. If the characteristic impedance is adopted as the parameter to be measured, larger changes are likely to appear in the measured value even when only a small number of elemental wires 3*a* and 3*b* break or are damaged than in the case other electrical parameters, such as electrical resistance, are adopted. Thus, higher detection sensitivity is achieved.

Furthermore, if a time-domain or frequency-domain method is employed for the measurement of the characteristic impedance, it is also possible to identify the position along the axial direction of the cable 1 where a break has occurred in the detection line conductor 31 due to application of the loads. In the case of the time-domain method, the position of the break can be determined by inputting a pulsed electrical signal to the detection line conductor 31 and converting the time at which a change in the obtained characteristic impedance is observed into a position along the axial direction of the cable 1. In the case of the frequency-domain method, an electrical signal containing multiple frequency components is input to the detection line conductor 31, and the response signal is Fourier transformed to convert the information with respect to the frequency into the information with respect to the position along the cable 1. The measurement of the characteristic impedance of the detection line 3 should preferably be performed continuously or intermittently while the cable 1 is in use. Then, if signs of breakage occur in the wire conductors 21 of the target wires 2, the signs of breakage can be detected at an early stage and announced, for example, to a user of the device in which the cable 1 is installed. Alternatively, the measurement of the characteristic impedance of the detection line 3 may be performed at predetermined timings, such as timings of periodic inspections of the devices in which the cable 1 is installed.

Figure 3:
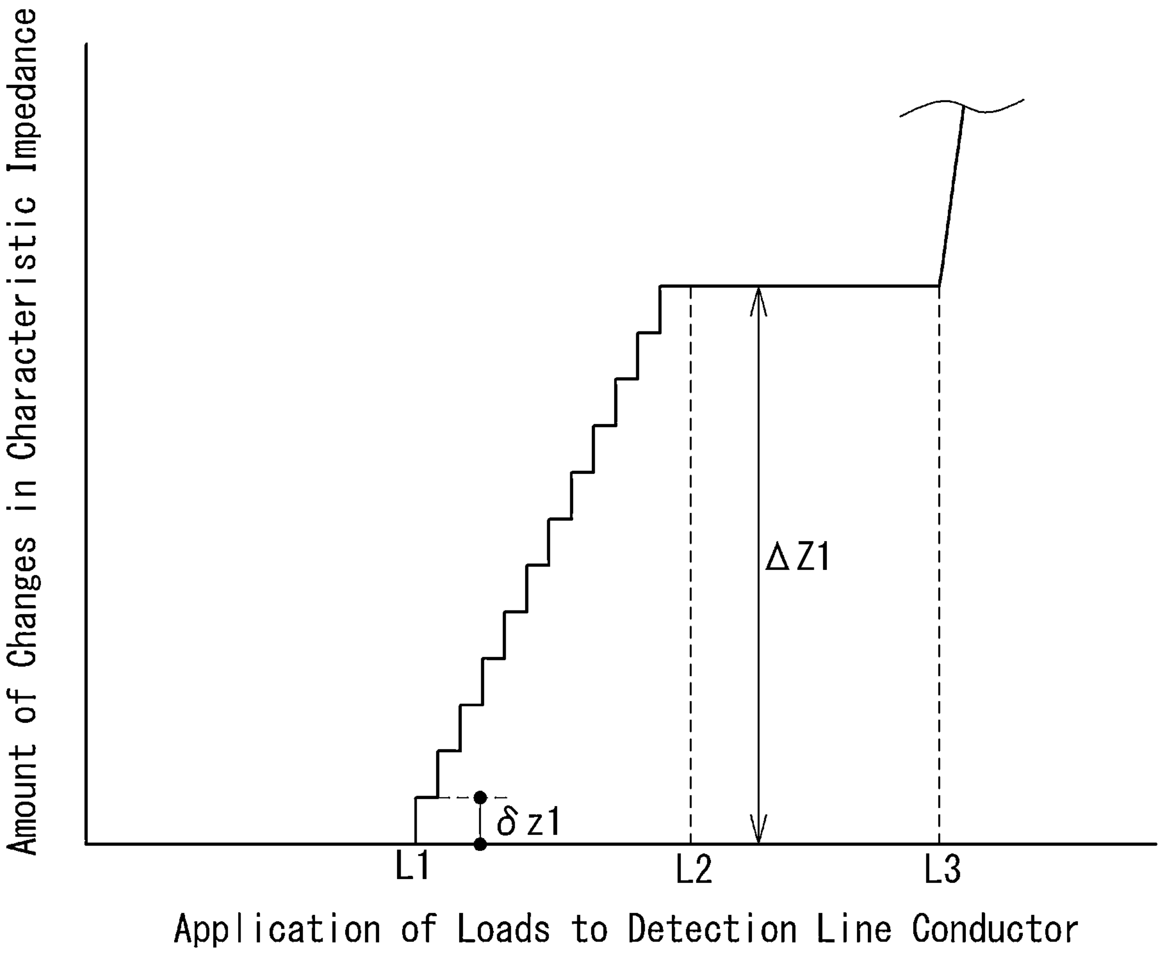
FIG. 3 shows the relationship between the degree of loads applied to the detection line conductor and the changes in the characteristic impedance in the detection line.

In the detection line conductor 31 of the cable 1 according to the present embodiment, the short-life elemental wires 3*b* have a shorter flex life than the long-life elemental wires 3*a*. Therefore, when the detection line conductor 31 is repeatedly subjected to loads due to bending or vibration of the cable 1, the short-life elemental wires 3*b* break before the long-life elemental wires 3*a*. Since the short-life elemental wires 3*b* and the long-life elemental wires 3*a* thus break at different timings, the characteristic impedance of the detection line conductor 31 changes in a stepwise manner. FIG. 3 shows the amount of changes in the characteristic impedance with respect to the degree of loads (e.g., number of bending cycles) applied to the detection line conductor 31 over time. As shown in the figure, as the application of loads to the detection line conductor 31 progresses, the short-life elemental wire 3*b* breaks first, and the characteristic impedance increases (at higher load levels than level L1). In FIG. 3, ΔZ1 indicates the amount of change in the characteristic impedance caused by breaks of all of the short-life elemental wires 3*b*. If the application of loads to the detection line conductor 31 further progresses, the long-life elemental wires 3*a* also break. The characteristic impedance then increases further (at higher load levels than level L3). The phenomenon in which the short-life elemental wires 3*b* and further the long-life elemental wires 3*a* break in the detection line conductor 31 indicates that the cumulative application of loads progresses in the cable 1 as a whole due to repeated bending, for example. In other words, the phenomenon means that the possibility of breakage in the target wires 2 due to metal fatigue.

Thus, by detecting the stepwise changes in the characteristic impedance of the detection line conductor 31 derived from the difference in the flex life between the short-life elemental wires 3*b* and the long-life elemental wires 3*a*, it is possible to determine the degree of urgency of the signs of breakage in the target wires 2 (i.e., how further additional loads will actually cause the breakage) in two stages. Specifically, at a stage when only changes in the characteristic impedance (i.e., changes within ΔZ1) corresponding to breaks of the short-life elemental wires 3*b* are observed, the imminence of breakage in the target wires 2 can be judged to be not so high yet. On the other hand, when changes in the characteristic impedance corresponding to breaks of the long-life elemental wires 3*a* start to occur, the changes indicate that the imminence of breakage in the target wires 2 is growing higher. Thus, the degree of urgency of the signs of breakage in the target wires 2 can be detected through the stepwise changes in the characteristic impedance of the detection line conductor 31, which allows measures, such as issuance of alarms in accordance with the degree of urgency, to be taken in the device in which the cable 1 is installed. When the cable 1 includes multiple target wires 2 having different flex lives, such as the power wires 2A and 2B and the communication wires 2C and 2D, the cable 1 may be configured, for example, so that signs of breakage in the target wire(s) 2 with a shorter flex life, such as the power wires 2A and 2B, are detected through breaks of the short-life elemental wires 3*b*, whereas the signs of breakage in the target wire(s) 2 with a longer flex life, such as the communication wires 2C and 2D, are detected through breaks of the long-life elemental wires 3*a*.

According to a more detailed analysis of the progress of breaks of the short-life elemental wires 3*b* due to the application of loads such as by bending, when the detection line conductor 31 is subjected to loads due to repeated bending or vibration, it is rare for all of the short-life elemental wires 3*b* to break at once unless extremely large loads are applied. Instead, the short-life elemental wires 3*b* tend to break sequentially, either one by one or several by several, increasing the number of broken short-life elemental wires 3*b* gradually during a certain period of time. If one or some of the short-life elemental wires 3*b* break, the continuity of conduction in the broken short-life elemental wires 3*b* is interrupted at the position of the break, whereby the value of the characteristic impedance measured for the detection line conductor 31 as a whole changes according to the number of broken short-life elemental wires 3*b*.

However, if the short-life elemental wires 3*b* and the long-life elemental wires 3*a* do not have the insulation coating layers 3*c* and have conduction with each other, then even after a short-life elemental wire 3*b* breaks, an adjacent unbroken short-life elemental wire 3*b* or long-life elemental wire 3*a* will contact the broken short-life elemental wire 3*b* and bridge the broken portion. Thus, the continuity of conduction is not interrupted in the broken short-life elemental wire 3*b* (i.e., chattering, namely reformation of conduction, occurs). As a result, either no change occurs in the characteristic impedance of the detection line conductor 31, or only small or slow changes occur.

In contrast, in the present embodiment, the short-life elemental wires 3*b* and the long-life elemental wires 3*a* are individually insulated from each other by the insulation coating layers 3*c*. Thus, when a short-life elemental wire 3*b* breaks, the state where the continuity of conduction is interrupted in the broken short-life elemental wire 3*b* at the position of the break is maintained stably because of the insulation of the broken short-life elemental wire 3*b* from the surrounding short-life elemental wires 3*b* and long-life elemental wires 3*a*. As a result, an influence of the break of the short-life elemental wire 3*b* arises in the measured value of characteristic impedance of the detection line conductor 31 significantly and clearly.

In other words, when stepwise breaks of the short-life elemental wires 3*b* proceed as loads are cumulatively applied to the cable 1, such as by bending, the characteristic impedance of the detection line conductor 31 exhibits clear stair-like changes, where the value of the characteristic impedance rapidly changes (typically increases) from a stable state, and settles into another stable state after the rapid change, as shown in FIG. 3. A typical amount of the change in the characteristic impedance corresponding to a break of one single short-life elemental wire 3*b* is represented as δz1 in FIG. 3. When the short-life elemental wires 3*b* break one by one as the application of loads to the detection line conductor 31 progresses, changes are accumulated in the characteristic impedance by small steps such as of the changing amount of δz1, although the magnitude of the steps is not necessarily constant. The value of the characteristic impedance thus increases sequentially in a stair-like manner. When all of the short-life elemental wires 3*b* break (at load level L2), the changes in the characteristic impedance accumulated from the initial stage of the breaks of the short-life elemental wires 3*b* (from load level L1) reach ΔZ1.

Thus, through the detection of stair-like changes in the characteristic impedance of the detection line conductor 31 in small steps corresponding to the one-by-one breaks of the short-life elemental wires 3*b*, occurrence of stepwise breaks of the short-life elemental wires 3*b* can be detected. The number of broken short-life elemental wires 3*b* can also be estimated based on the number and amount of the stair-like changes. As described above, the degree of urgency of the signs of breakage in the target wires 2 can be detected in two broad stages through separate detection of the breaks of the short-life elemental wires 3*b* and the long-life elemental wires 3*a* based on the changes in the characteristic impedance of the detection line conductor 31. Furthermore, the signs of breakage in the target wires 2 can be detected in more finely divided stages, through stepwise detection of the breaks of the short-life elemental wires 3*b* in a one-by-one manner. These make it easier to take various and appropriate countermeasures for the wire breakage depending on the stage of imminence of wire breakage.

Here, in order to detect changes in the characteristic impedance of the detection line conductor 31 in small steps corresponding to one-by-one breaks of the short-life elemental wires 3*b* as distinct stair-like changes, it is important to prevent chattering by individually providing the short-life elemental wires 3*b* and the long-life elemental wires 3*a* with the insulation covering layers 3*c*, as described above. In addition, the configuration of the detection line conductor 31, where the short-life elemental wires 3*b* and the long-life elemental wires 3*a* are arranged in separated concentric layers, with the short-life elemental wires 3*b* located on the outer circumference of the entire detection line conductor 31, also has a significant contribution to the phenomenon in which the short-life elemental wires 3*b* break earlier than the long-life elemental wires 3*a* in the one-by-one manner, causing clear changes in the characteristic impedance.

As already explained, since the short-life elemental wires 3*b* have a shorter flex life than the long-life elemental wires 3*a*, the short-life elemental wires 3*b* break earlier than the long-life elemental wires 3*a* when subjected to loads such as by bending. Furthermore, even if the elemental wires constituting the conductor are identical, the elemental wires located in a more exterior area within the conductor are subjected to greater loads when the conductor is bent, and are more likely to break even after a small number of bending cycles. This is because the elemental wires located on the outermost circumference of the conductor are bent with the smallest curvature radius on the inner side of the bent shape. Since the short-life elemental wires 3*b* are arranged around the bundle of the long-life elemental wires 3*a* in the detection line conductor 31 of the cable 1 according to the present embodiment, this arrangement amplifies the difference in flex life between the long-life elemental wires 3*a* and the short-life elemental wires 3*b* derived from the intrinsic properties of the elemental wires, thereby making the tendency more pronounced where the short-life elemental wires 3*b* break after fewer bending cycles than the long-life elemental wires 3*a*.

If the long-life elemental wires 3*a* and the short-life elemental wires 3*b* are arranged alternately in the circumferential direction of the detection line, as in Patent Document 3, or randomly, or if the long-life elemental wires 3*a* are located in a more exterior area than the short-life elemental wires 3*b*, the arrangement of the two types of elemental wires 3*a* and 3*b* mitigates the difference between their flex lives as intrinsic properties of the elemental wires. Even the elemental wires 3*a*, if located on the outer circumference of the detection line conductor 31, are likely to break relatively early, while even the short-life elemental wires 3*b*, if located in the inner portion of the detection line conductor 31, are less likely to break over a relatively long period of time. This would make it difficult for the two types of elemental wires 3*a* and 3*b* to break in a sequential manner, where the short-life elemental wires 3*b* first break in a one-by-one stepwise manner, and the long-life elemental wires 3*a* then begin to break. Even if the two types of elemental wires 3*a* and 3*b* break in a sequential manner, only a small time gap would be made between the breaks of the two types of elemental wires 3*a* and 3*b*. In these cases, stair-like changes in the characteristic impedance due to the breaks of the individual short-life elemental wires 3*b*, like those shown in FIG. 3, are less likely to occur. In contrast, in the detection line conductor 31 in the present embodiment, the areas where the two types of elemental wires 3*a* and 3*b* with different flex lives are placed are mutually separated into concentric layers: the area where the long-life elemental wires 3*a* are located is in an inner position while the area where the short-life elemental wires 3*b* are located is in an outer position. As a result, the breaks of the elemental wires 3*a* and 3*b* occur sequentially and at well separated timings in the order according to their flex lives. In other words, the short-life elemental wires 3*b* break first in a one-by-one manner, and then the long-life elemental wires 3*a* break at a timing well separated after (almost) all of the short-life elemental wires 3*b* break. In this way, the breaks of the elemental wires 3*a* and 3*b* proceed sequentially in a well-ordered and separated manner. Thus, the changes in the characteristic impedance corresponding to the one-by-one breaks of the short-life elemental wires 3*b* can be detected as clear stair-like changes in multiple steps, even if the amount of the changes is small. As a result, the signs of breakage in the target wires 2 can be detected accurately in a stepwise manner.

Furthermore, the configuration where the short-life elemental wires 3*b* are located in a more external area than the long-life elemental wires 3*a* contributes to improving the accuracy of stepwise detection of the signs of wire breakage not only by actually causing the breaks of the elemental wires 3*a* and 3*b* in a clear stepwise manner as described above, but also by enhancing detection sensitivity of the breaks of the short-life elemental wires 3*b*. When detection of the breaks in the detection line conductor 31 is performed through an electrical measurement with an alternating current as in the characteristic impedance measurement, especially with an alternating current of high frequency such as 1 MHz or higher, the current flows intensively on the surface of the detection line conductor 31 due to a skin effect. In other words, the current flows intensively in the short-life elemental wires 3*b* located on the outer circumference of the entire detection line conductor 31. Thus, the electrical parameters measured for the entire detection line conductor 31, such as the characteristic impedance, has significant contribution from the short-life elemental wires 3*b*, whereby changes in the state of the short-life elemental wires 3*b*, such as breaks, are significantly reflected in the parameters. As a result, when breaks occur in the short-life elemental wires 3*b*, large changes appear in the characteristic impedance of the detection line conductor 31 and is detected with high sensitivity as clear stair-like changes.

As described in the foregoing, in the detection line conductor 31, the long-life elemental wires 3*a* and the short-life elemental wires 3*b* are individually covered with the insulation covering layers 3*c*, and the short-life elemental wires 3*b* are arranged in a layer around the bundle of the long-life elemental wires 3*a*. As a result, one-by-one breaks of the individual short-life elemental wires 3*b* due to the application of loads such as by bending are clearly detected as changes in the characteristic impedance of the detection line conductor 31. Through the changes in the characteristic impedance, the degree of urgency of the signs of breakage in the target wires 2 can be detected in multiple, finely divided stages with high accuracy. After the breaks of all the short-life elemental wires 3*b*, breaks of the long-life elemental wires 3*a* further occur. Thus, small-step changes in the characteristic impedance, such as changes by δz1 corresponding to breaks of the individual short-life elemental wires 3*b*, can be used as indicators of gradual progression of increase in the degree of urgency of the signs of breakage in the target wires 2. Meanwhile, the phenomenon in which the characteristic impedance exhibits first a large change of ΔZ1 as a result of accumulation of the small-step changes and subsequently a change corresponding to breaks of the long-life elemental wires 3*a* can be used for judgment of the urgency of the signs of breakage in the target wires 2 over a broader range that can not be covered only by the stepwise breaks of the short-life elemental wires 3*b*. For example, in the case where the cable 1 includes multiple target wires 2 with different flex lives such as the power wires 2A and 2B and the communication wires 2C and 2D, the cable 1 may be configured so that the signs of breakage in the target wires 2 with short flex life, such as the power wires 2A and 2B, are detected through the stepwise breaks of the short-life elemental wires 3*b*, with distinguishing the degree of urgency, whereas the signs of breakage in the target wires 2 with long flex life, such as the communication wires 2C and 2D, are detected through the breaks of the long-life elemental wires 3*a*. Thus, the stepwise breaks of the short-life elemental wires 3*b* can be used as indicators for starting preparation for possible wire breakage, such as reserving a spare of the cable 1, at an early stage when the signs of breakage are still not so serious in the target wires 2, whereby appropriate measures can be taken before breakage of the target wires 2 becomes imminent.

Though the above-presented description explained the detection of stepwise breaks of the short-life elemental wires 3*b* in a one-by-one manner, the long-life elemental wires 3*a* can also break in a stepwise manner like the short-life elemental wires 3*b*. Furthermore, since the long-life elemental wires 3*a* are also covered individually with the insulation coating layers 3*c*, the stepwise breaks of the long-life elemental wires 3*a* may be able to be detected through stair-like changes in the characteristic impedance, as in the case of the breaks of the short-life elemental wires 3*b*. However, since the long-life elemental wires 3*a* are located inside the detection line conductor 31, a phenomenon is less likely to occur where the long-life elemental wires 3*a* break one-by-one at sufficiently separated timings, compared to the short-life elemental wires 3*b*. Even if the phenomenon occurs, it is difficult to be detected clearly as changes in the characteristic impedance. If stepwise changes in the characteristic impedance can be detected corresponding to one-by-one or several-by-several breaks of the long-life elemental wires 3*a*, depending on specific configuration and constituent material of the detection line conductor 31, the stepwise changes can also be used as indicators showing the degree of urgency of the signs of breakage in the target wires 2 in a stepwise manner. Furthermore, though the detection line conductor 31 in the above-described embodiment consists of two types of elemental wires, i.e., the short-life elemental wires 3*b* and the long-life elemental wires 3*a*, three or more types of elemental wires having mutually different flex lives may be arranged in multiple layers in the order where the flex lives of the elemental wires decrease from the inner layer to the outer layer. In this case, the signs of breakage in the target wires 2 can be detected while graded according to the degree of urgency in an even broader range.

(4) Wire Abnormality Sign Detection System

Finally, a wire abnormality sign detection system according to an embodiment of the present disclosure will be described briefly. The wire abnormality sign detection system contains the cable with the abnormality sign detection function 1 according to the above-described embodiment of the present disclosure and a measurement unit. The measurement unit is a measuring device that measures the characteristic impedance of the detection line conductor 31 of the detection line 3 included in the cable with the abnormality sign detection function 1.

As explained above for the cable with the abnormality sign detection function 1, the value of the characteristic impedance of the detection line conductor 31 changes sensitively, reflecting breaks of the elemental wires 3*a* and 3*b* in the detection line conductor 31. In other words, when the accumulation of loads, such as by bending or vibration, causes breaks of the short-life elemental wires 3*b* one by one or in small groups and then breaks of the long-life elemental wires 3*a*, the characteristic impedance of the detection line conductor 31 as a whole increases in a stepwise manner, as shown in FIG. 3. When the characteristic impedance measured by the measurement unit exhibits such stepwise changes, it can be judged that signs of breakage are present in the target wires 2 contained in the cable 1. Furthermore, the degree of urgency of the signs of breakage in the target wires 2 can be detected in a stepwise manner according to the degree of increase in the characteristic impedance.

EXAMPLE

A description of examples will now be presented. Here, computer simulation was used to confirm that clear changes occur in the characteristic impedance when elemental wires constituting a detection line conductor break sequentially, starting from those located on the outer circumference of the conductor. It should be noted that the present invention is not limited to the examples.

Method of Examination

Figure 4:
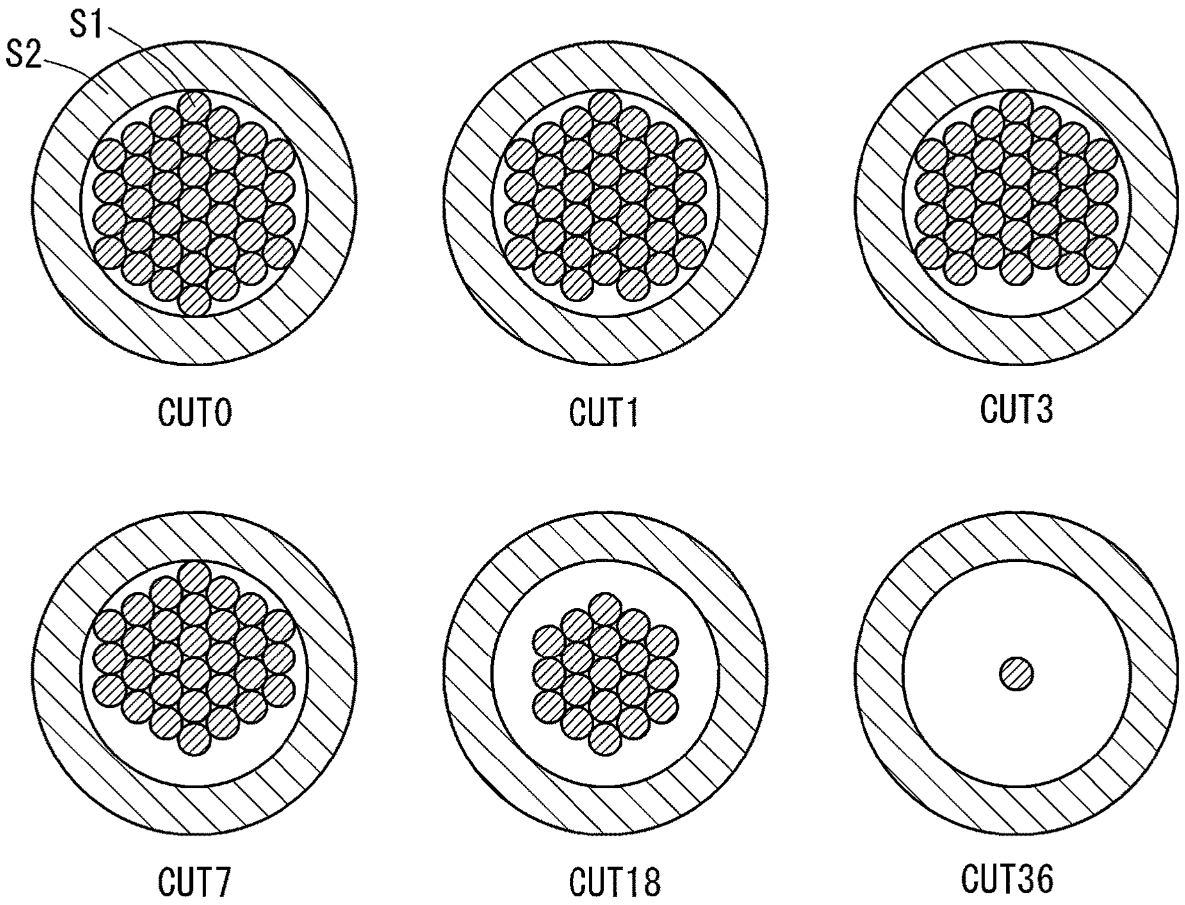
FIG. 4 shows cross-sectional views of the states of the detection line used for the simulation.

As a model for examination, a detection line was prepared as shown in FIG. 4 as CUT0. The detection line contained 37 elemental wires S1, each consisting of enameled wires having a diameter of 0.1 mm, and an insulation covering S2 to have a diameter of 1.0 mm. The length of the detection line was 1 m. Each of the enameled wires contains a conductor made of copper with a diameter of φ0.08 mm and an enamel coating with a thickness of 0.01 mm. In order to mimic breaks of the elemental wires, a 10-mm long area where some of the wires were removed was formed in the longitudinal center of the detection line. States named CUT1, CUT3, CUT7, CUT18, and CUT36 were created where the number of the elemental wires having the breaks was increased in the order, as shown in FIG. 4. The numeral after the term "CUT" indicates the number of the elemental wires having breaks in each of the states. Sequential breaks of the elemental wires from the bottom portion of the outer circumference of the bundle in the figure are mimicked in the order from CUT0 to CUT36.

A simulation for circuit analysis using electromagnetic field analysis was performed for the detection lines in each state from CUT0 to CUT36 described above to estimate the characteristic impedance of the detection line. A software for electromagnetic field analysis named "Ansys HFSS" was used for the simulation. In the estimation of the characteristic impedance, an insulated wire identical to the above-described detection line in the state having no break in the elemental wires (i.e., state of CUT0) was placed adjacent to the bottom side of the detection line. The potential of the insulated wire was set as the ground potential. The termination resistance was set to 50Ω.

Results of Examination

Figure 5:
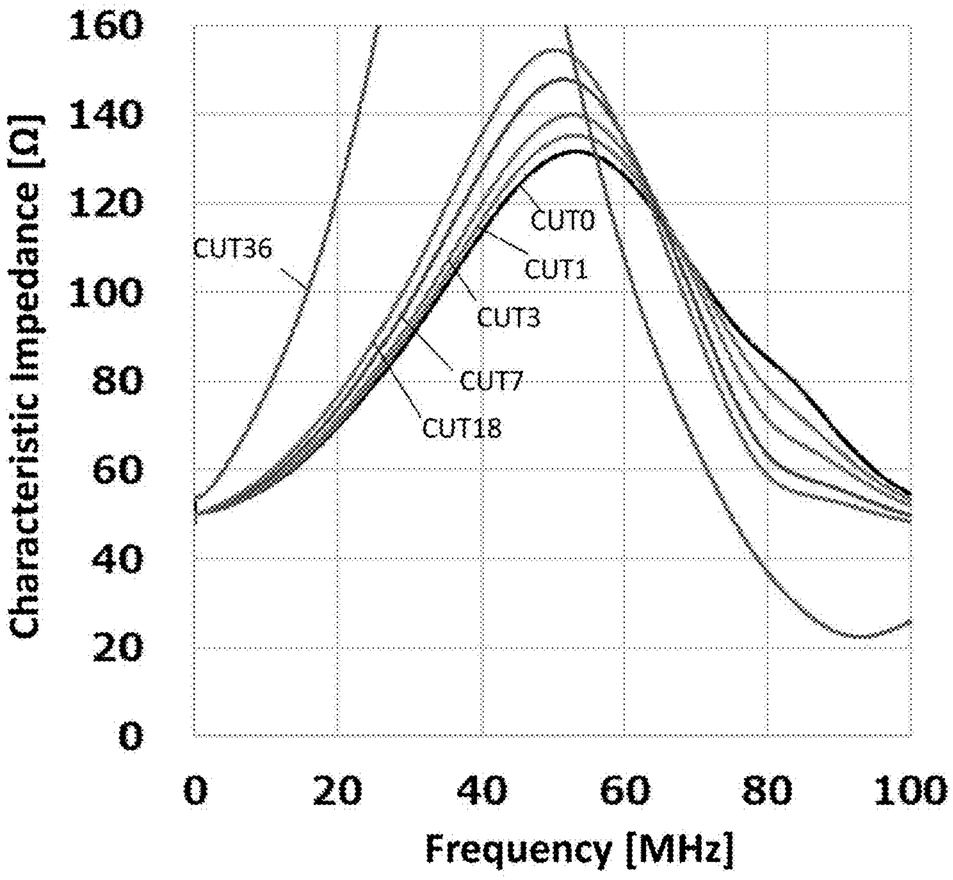
FIG. 5A shows the characteristic impedance obtained by the simulation for the respective states of the detection line.
FIG. 5B shows the relationship between the number of broken elemental wires and the value of characteristic impedance at 50 MHz.
Figure 5:
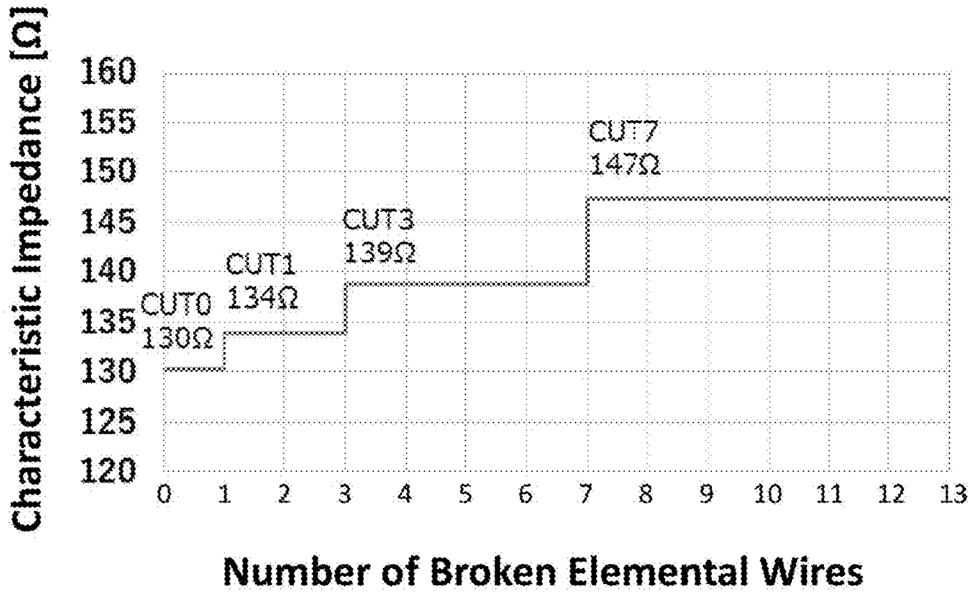

FIG. 5A shows the characteristic impedance obtained by the simulation for each state from CUT0 to CUT36 in the frequency range of 0 to 100 MHz. FIG. 5B shows the change in the value of characteristic impedance at 50 MHz, as extracted from the results in FIG. 5A, in the phase where the number of breaks in the elemental wires stays small. The horizontal axis indicates the number of elemental wires having breaks, while the vertical axis indicates the characteristic impedance.

FIG. 5A shows that the value of characteristic impedance increases at and around the peak tops as the number of elemental wires having breaks increases. FIG. 5B shows more clearly that the characteristic impedance increases in a stepwise manner as the number of elemental wires having breaks increases. In other words, the figures show that when the elemental wires break one by one or several by several, the breaks of the elemental wires cause stepwise increases in the characteristic impedance.

As also explained above, when a structure is adopted for the detection line conductor in which long-life elemental wires are located inside while short-life elemental wires are located around the bundle of long-life elemental wires, as in the cable with the abnormality sign detection function according to the embodiment of the present disclosure, breaks of the elemental wires are likely to proceed from the outer circumference of the conductor. This is caused by the effect of the arrangement of the elemental wires, where the elemental wires located in a more exterior area are more likely to break, as well as by the effect of the difference in the intrinsic flex lives of the elemental wires. The results of the simulation show that when the elemental wires thus break sequentially from the outer circumference of the detection line conductor, the characteristic impedance increases in a stair-like manner corresponding to the one-by-one or several-to-several breaks of the short-life elemental wires, as shown schematically in FIG. 3.

The foregoing description has been presented for a detailed illustration of the embodiments of the present disclosure; however, the present invention is not limited by the above-described embodiments, and modifications and variations are possible as long as they do not deviate from the principles of the present invention.

DESCRIPTION OF REFERENCE NUMERALS

1 Cable (with abnormality sign detection function)
2 Target wire
2A and 2B Power wire
2C and 2D Communication wire
21 (21A-21D) Wire conductor
22 Wire covering
3 Detection line
31 Detection line conductor
32 Detection line covering
3*a* Long-life elemental wire
3*a*1 Solid wire made of conductive material
3*b* Short-life elemental wire
3*b*1 Solid wire made of conductive material
3*c* Insulation layer
4 Tape layer
5 Sheath
51 Outer layer
52 Inner layer
G Wire group
S1 Elemental wire
S2 Insulation coating

The invention claimed is:

1. A cable with an abnormality sign detection function, comprising:
a target wire comprising:
a wire conductor; and
a wire covering that covers the wire conductor; and
a detection line comprising:
a detection line conductor; and
a detection line covering that covers the detection line conductor, wherein
the detection line conductor, as a whole, has a shorter flex life than the wire conductor, the detection line conductor comprises:
long-life elemental wires; and
short-life elemental wires having a shorter flex life than the long-life elemental wires,
each of the long-life and short-life elemental wires comprising:
a solid wire made of a conductive material; and
an insulation covering layer covering the solid wire, and
in the detection line conductor, the short-life elemental wires are arranged in a layer around a bundle of the long-life elemental wires.

2. The cable according to claim 1, wherein the long-life and short-life elemental wires have mutually different flex lives by having a difference in at least one of a constituent material and diameter of the solid wire.

3. The cable according to claim 1, wherein the conductive material composing the long-life elemental wires is a copper alloy, and the conductive material composing the short-life elemental wires is copper or a copper alloy having lower flex durability than the conductive material composing the long-life elemental wires.

4. The cable according to claim 1, wherein the conductive material composing the long-life elemental wires is an aluminum alloy, and the conductive material composing the short-life elemental wires is aluminum or an aluminum alloy having lower flex durability than the conductive material composing the long-life elemental wires.

5. The cable according to claim 1, comprising:
a power wire; and
a communication wire,
each of which constitutes the target wire.

6. A wire abnormality sign detection system, comprising:
the cable with the abnormality sign detection function according to claim 1; and
a measurement unit to measure a characteristic impedance of the detection line conductor of the detection line contained in the cable.

* * * * *